United States Patent
Sakai et al.

(10) Patent No.: US 6,819,688 B2
(45) Date of Patent: Nov. 16, 2004

(54) SEMICONDUCTOR LASER DEVICE AND OPTICAL FIBER AMPLIFIER

(75) Inventors: Kiyohide Sakai, Tokyo (JP); Yuuhiko Hamada, Tokyo (JP); Takeshi Fujita, Tokyo (JP); Yasuaki Yoshida, Tokyo (JP); Kimio Shigihara, Tokyo (JP); Tatsuo Hatta, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 186 days.

(21) Appl. No.: 10/073,221

(22) Filed: Feb. 13, 2002

(65) Prior Publication Data

US 2003/0103544 A1 Jun. 5, 2003

(30) Foreign Application Priority Data

Nov. 30, 2001 (JP) ........................................ 2001-367479

(51) Int. Cl.[7] ................................................ H01S 3/30
(52) U.S. Cl. ................................ 372/6; 372/43; 372/45
(58) Field of Search ................................ 372/6, 43, 45

(56) References Cited

U.S. PATENT DOCUMENTS

| 4,671,830 A | * | 6/1987 | Burnham | 372/45 |
| 4,759,030 A | * | 7/1988 | Murayama et al. | 372/45 |
| 5,715,263 A | * | 2/1998 | Ventrudo et al. | 372/6 |
| 6,295,306 B1 | * | 9/2001 | Asami | 372/20 |
| 6,411,639 B1 | * | 6/2002 | Namiwaka | 372/92 |
| 6,525,872 B1 | * | 2/2003 | Ziari et al. | 359/341.3 |

FOREIGN PATENT DOCUMENTS

JP  2000-353856  12/2000

OTHER PUBLICATIONS

Martin Achtenhagen et al., "Characteristics of Fiber Bragg Grating Stabilized 980–nm Pump Lasers", IEEE Photonics Technology Letters, vol. 13, No. 5, May 2001, pp. 415–417.
Raymond Dingle, "Confirmed Carrier Quantum States in Ultrathin Semiconductor Heterostructures", Festkorperprobleme XV (1975), Advances in Solid–State Physics, pp. 21–48.

* cited by examiner

Primary Examiner—Don Wong
Assistant Examiner—Cornelius H. Jackson
(74) Attorney, Agent, or Firm—Burns, Doane, Swecker & Mathis, L.L.P.

(57) ABSTRACT

A semiconductor laser device comprises an optical fiber having an optical fiber grating formed therein, a semiconductor laser having an active layer with a single quantum well, for emitting laser light, and a coupling optical system for coupling the laser light emitted out of the semiconductor laser into the optical fiber. The coupling optical system can include a narrow-band filter for adjusting an incident angle of the laser light emitted out of the semiconductor laser. The optical fiber grating can have a reflection bandwidth wider than or substantially equal to a 3 dB bandwidth of the gain of the semiconductor laser or a spectrum full width at half maximum of the laser light of the semiconductor laser.

24 Claims, 8 Drawing Sheets

FIG.8
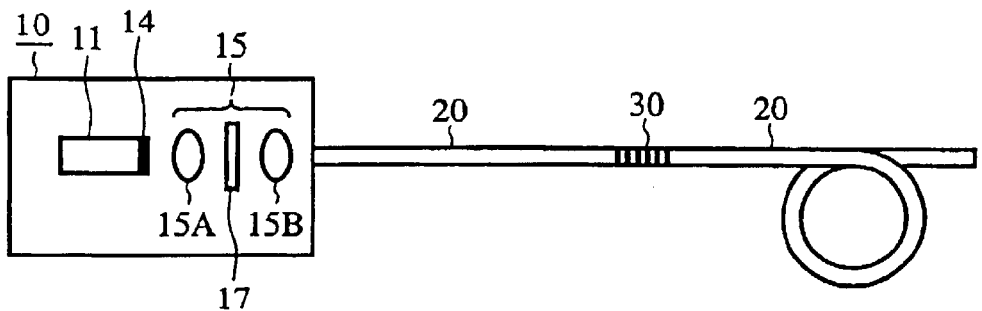
FIG. 9
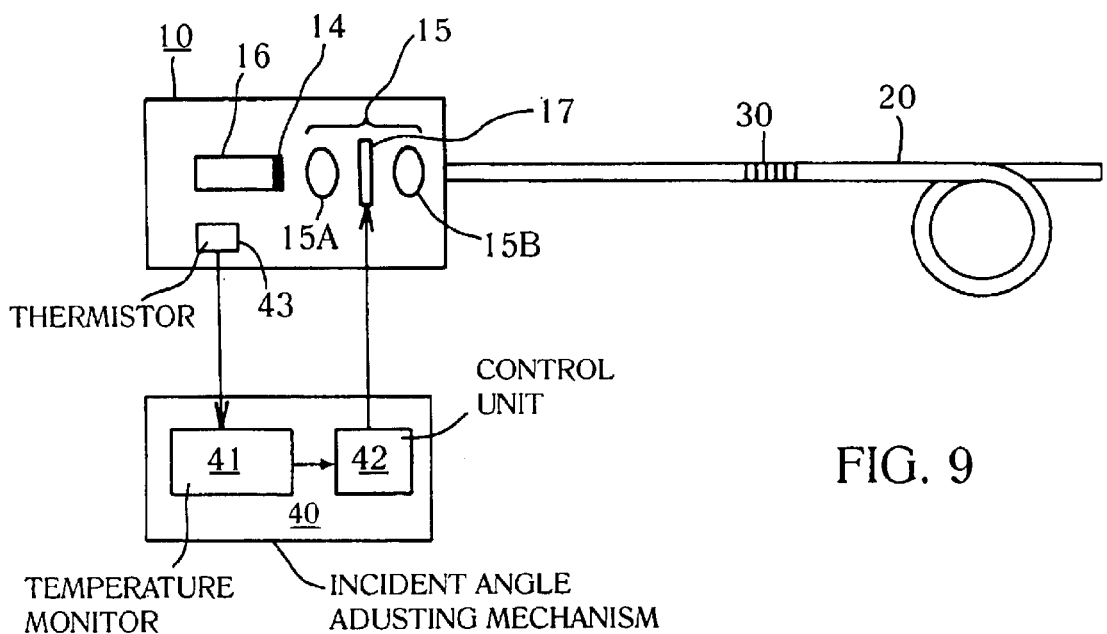
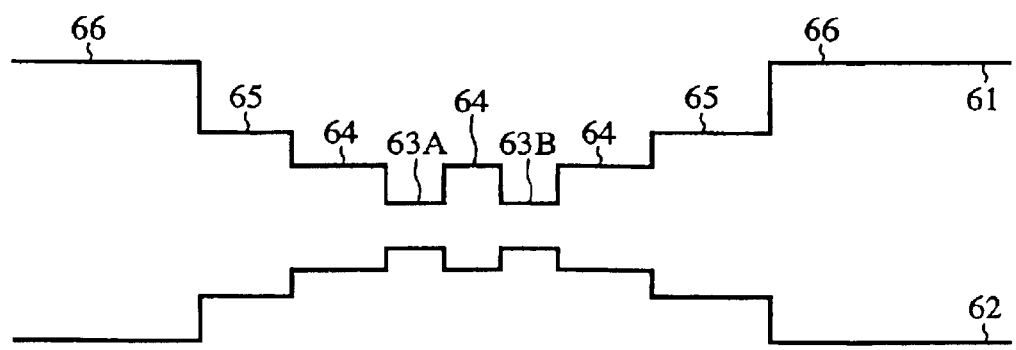
FIG. 10

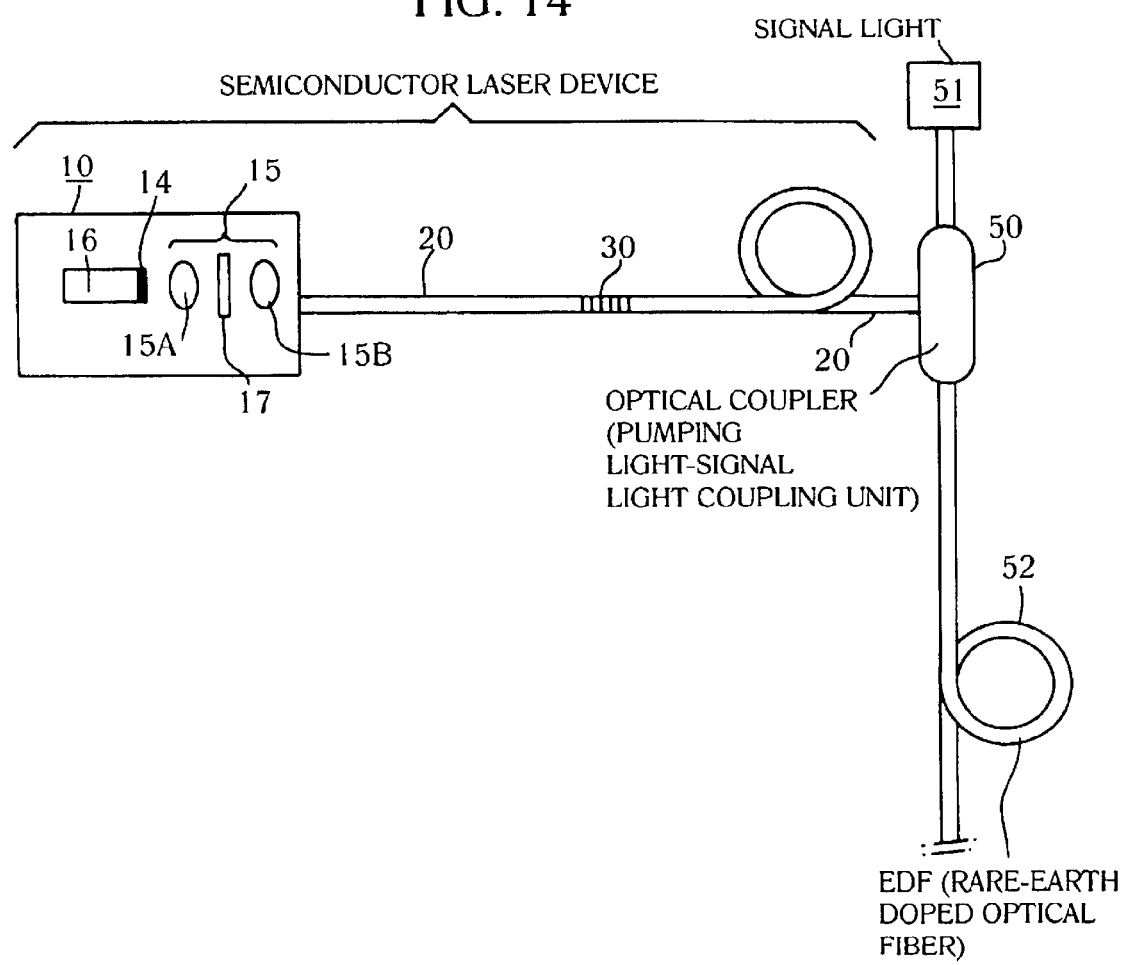

SEMICONDUCTOR LASER DEVICE AND OPTICAL FIBER AMPLIFIER

BACKGROUND OF THE INVENTION

1. Field of the Invention

The present invention relates to a semiconductor laser device for controlling changes in the emission wavelength of laser light emitted out of a semiconductor laser by means of an optical fiber grating. The present invention also relates to an optical fiber amplifier which uses the semiconductor laser device.

2. Description of the Prior Art

FIG. 11 is a diagram showing the structure of a prior art semiconductor laser device. In FIG. 11, reference numeral 110 denotes a pump laser module that emits laser light, reference numeral 120 denotes an optical fiber for guiding the laser light from the pump laser module 110, and reference numeral 130 denotes an optical fiber grating formed in the optical fiber 120.

Furthermore, in the pump laser module 110 of FIG. 11, reference numeral 111 denotes a 980-nm band semiconductor laser (i.e. laser diode), reference numeral 112 denotes a temperature monitor for monitoring the temperature of the pump laser module 110, reference numeral 113 denotes a cooler for keeping the temperature of the pump laser module 110 constant according to the monitoring result of the temperature monitor 112, and reference numeral 115 denotes a coupling optical system for coupling light emitted out of the semiconductor laser 111 into an optical fiber 120.

980-nm band laser light is used for the excitation of an erbium-doped fiber amplifier (EDFA). Since the gain-wavelength characteristic of EDFA changes when the emission wavelength of the laser light changes during the excitation, an optical fiber grating 130 is disposed at the output of the pump laser module 110 as measures against changes in the gain-wavelength characteristic.

FIG. 12 is a diagram showing an example of the structure of the semiconductor laser 111. In FIG. 12, reference numeral 111a denotes an n-type electrode, reference numeral 111b denotes a GaAs substrate, reference numeral 111c denotes an n-type cladding layer, reference numeral 111d denotes a multiple quantum well (MQW) active layer, reference numeral 111e denotes a p-type cladding layer, and reference numeral 111f denotes a p-type electrode. In the prior art semiconductor laser device, the semiconductor laser 111 having the MQW active layer 111d is used.

FIG. 13 is a diagram showing an energy band structure in the vicinity of the MQW active layer 11d of the semiconductor laser 111. In FIG. 13, reference numeral 142 denotes a conduction band, reference numeral 143 denotes a valence band, reference numerals 146A and 146B denote quantum wells, respectively, reference numeral 147 denotes a barrier layer, reference numeral 144 denotes a guide layer, and reference numeral 145 denotes a cladding layer. Each of the two quantum wells 146A and 146B is composed of InGaAs of In chemical composition of 0.2. The barrier layer 147 is composed of AlGaAs of Al chemical composition of 0.2. The guide layer 144 is composed of AlGaAs of Al chemical composition of 0.2. The cladding layer 145 is composed of AlGaAs of Al chemical composition of 0.48.

In general, the number of wells included in the MQW active layer 111d ranges from 2 to 4. Each of the two quantum wells 146A and 146B has a thickness Lz ranging from 5 nm to 15 nm, the barrier layer 147 has a thickness Lb ranging from 10 nm to 50 nm, and the guide layer 144 has a thickness ranging from 10 nm to 500 nm. The Al chemical composition of the above-mentioned AlGaAs is adjusted between 0.0 and 0.5 from the viewpoint of optical confinement.

Population inversion is formed by an electric current's flowing in a forward direction between the p-type electrode 111f and the n-type electrode 111a, and hence injecting electrons and holes into the MQW active layer 111d. As a result, the semiconductor laser 111 oscillates at a 980-nm band of emission wavelengths determined by the bandgap of the MQW active layer 111d, and emits laser light to the optical fiber 120 by way of the coupling optical system 115.

In general, since the semiconductor laser uses interband transitions, it has a gain over a wide wavelength range (e.g., ten-odd nm). The emission wavelength of the semiconductor laser 111 differs and changes according to chip-to-chip variations and change in temperature. Therefore, the change in the emission wavelength of the semiconductor laser device is controlled by the optical fiber grating 130 disposed as an external resonator in the prior art semiconductor laser device. For example, details of the semiconductor laser device provided with the optical fiber grating 130 are disclosed in <Reference 1>.

<Reference 1>: Martin Achtenhagen, et al.: "L-I Characteristics of Fiber Bragg Grating Stabilized 980-nm Pump Lasers", IEEE PHOTONICS TECHNOLOGY LETTERS, VOL. 13, NO. 5, MAY 2001.

When the temperature of the pump laser module 110 changes greatly because of a self heating of the semiconductor laser 111 and change in ambient temperature, the wavelength characteristic of the threshold gain distribution also changes. On the other hand, since the wavelength characteristic of the optical fiber grating 130 remains fixed, the semiconductor laser 111 does not oscillate in external resonance mode and therefore the emission wavelength cannot be kept constant.

To avoid this problem, a temperature control mechanism is disposed in the semiconductor laser device of FIG. 11. In other words, the prior art semiconductor laser device is so constructed as to monitor the temperature of the pump laser module 110 by means of the temperature monitor 112, to control an electric current flowing through the cooler 113 by means of a temperature controller not shown in the figure, and to keep the temperature of the pump laser module 110 constant. Thus, the semiconductor laser device can stabilize the emission wavelength, and can control the change in the gain-wavelength characteristic when applied to EDFA. Japanese patent application publication No. 2000-353856 discloses a prior art technology associated with the semiconductor laser device mentioned above, for example.

A problem with a prior art semiconductor laser device constructed as mentioned above is that to keep the emission wavelength constant the semiconductor laser device has to have a temperature control mechanism that consists of a temperature monitor, a temperature controller, a cooler, etc., and the structure of the semiconductor laser device therefore becomes complex.

SUMMARY OF THE INVENTION

The present invention is proposed to solve the above-mentioned problem, and it is therefore an object of the present invention to provide a semiconductor laser device having a simple structure and capable of keeping the emission wavelength constant without having to use a temperature control mechanism.

It is another object of the present invention to provide a semiconductor laser device capable of controlling the change in the emission wavelength by means of a temperature control mechanism with low control resolution or low control performance.

It is a further object of the present invention to provide an optical fiber amplifier provided with such a semiconductor laser device as a source of pumping light, and capable of controlling the change in the gain-wavelength characteristic.

In accordance with an aspect of the present invention, there is provided a semiconductor laser device, comprising: an optical fiber having an optical fiber grating; a semiconductor laser having an active layer with a single quantum well, for emitting laser light; and a coupling optical system for coupling the laser light emitted out of the semiconductor laser into the optical fiber.

In accordance with another aspect of the present invention, the coupling optical system includes a narrow-band filter for adjusting an incident angle of the laser light emitted out of the semiconductor laser.

In accordance with a further aspect of the present invention, the optical fiber grating has a reflection bandwidth wider than or substantially equal to a 3 dB bandwidth of a gain of the semiconductor laser or a spectrum full width at half maximum of the laser light of the semiconductor laser.

In accordance with another aspect of the present invention, the coupling optical system has a narrow-band filter for adjusting an incident angle of the laser light emitted out of the semiconductor laser. Furthermore, the optical fiber grating has a reflection bandwidth wider than or substantially equal to a 3 dB bandwidth of a gain of the semiconductor laser or a spectrum full width at half maximum of the laser light of the semiconductor laser.

In accordance with a further aspect of the present invention, the coupling optical system includes a collimator lens for collimating the laser light emitted out of the semiconductor laser and for outputting the collimated laser light to the narrow-band filter, and a condenser lens for focusing the laser light output from the narrow-band filter onto the optical fiber.

In accordance with another aspect of the present invention, the semiconductor laser has an anti-reflection coating with a reflectivity of about 10% or less, which is formed on an emitting exit face thereof from which the laser light is emitted.

In accordance with a further aspect of the present invention, the anti-reflection coating has a reflectivity lower than that of the optical fiber grating.

In accordance with another aspect of the present invention, the semiconductor laser includes a layer having a refraction index lower than that of an optical guide layer disposed outside the active layer with the single quantum well, the layer having such a thickness as to prevent itself from becoming a barrier that keeps an electric current from flowing through the semiconductor laser and the layer being disposed outside the optical guide layer.

In accordance with a further aspect of the present invention, the active layer, a barrier layer, and a guide layer of the semiconductor laser are configured to have a distortion compensating structure.

In accordance with another aspect of the present invention, the optical fiber grating has a reflection bandwidth of 5 nm or more.

In accordance with a further aspect of the present invention, the narrow-band filter includes an incident angle adjusting mechanism for adjusting the narrow-band filter so that the incident angle of the laser light incident on the narrow-band filter approaches 90 degrees with increasing ambient temperature.

In accordance with another aspect of the present invention, the active layer with the single quantum well of the semiconductor laser has a thickness ranging from 10 nm to 25 nm.

In accordance with a further aspect of the present invention, there is provided a semiconductor laser device, comprising: an optical fiber having an optical fiber grating; a semiconductor laser having an active layer with two or more quantum wells formed at intervals that are close enough to provide quantum coupling, for emitting laser light; and a coupling optical system for coupling the laser light emitted out of the semiconductor laser into the optical fiber.

In accordance with another aspect of the present invention, the coupling optical system includes a narrow-band filter for adjusting an incident angle of the laser light emitted out of the semiconductor laser.

In accordance with a further aspect of the present invention, the optical fiber grating has a reflection bandwidth wider than or substantially equal to a 3 dB bandwidth of a gain of the semiconductor laser or a spectrum full width at half maximum of the laser light of the semiconductor laser.

In accordance with another aspect of the present invention, the coupling optical system has a narrow-band filter for adjusting an incident angle of the laser light emitted out of the semiconductor laser. Furthermore, the optical fiber grating has a reflection bandwidth wider than or substantially equal to a 3 dB bandwidth of a gain of the semiconductor laser or a spectrum full width at half maximum of the laser light of the semiconductor laser.

In accordance with a further aspect of the present invention, the coupling optical system includes a collimator lens for collimating the laser light emitted out of the semiconductor laser and for outputting the collimated laser light to the narrow-band filter, and a condenser lens for focusing the laser light output from the narrow-band filter onto the optical fiber.

In accordance with another aspect of the present invention, the semiconductor laser has an anti-reflection coating with a reflectivity of about 10% or less, which is formed on an emitting exit face thereof from which the laser light is emitted.

In accordance with a further aspect of the present invention, the anti-reflection coating has a reflectivity lower than that of the optical fiber grating.

In accordance with another aspect of the present invention, the active layer, a barrier layer, and a guide layer of the semiconductor laser are configured to have a distortion compensating structure.

In accordance with a further aspect of the present invention, the two or more quantum wells are formed at intervals of 8 nm or less.

In accordance with another aspect of the present invention, the optical fiber grating has a reflection bandwidth of 5 nm or more.

In accordance with a further aspect of the present invention, the narrow-band filter includes an incident angle adjusting mechanism for adjusting the narrow-band filter so that the incident angle of the laser light incident on the narrow-band filter approaches 90 degrees with increasing ambient temperature.

In accordance with another aspect of the present invention, there is provided an optical fiber amplifier comprising: a semiconductor laser device including an optical fiber having an optical fiber grating, a semiconductor laser having an active layer with a single quantum well, for emitting pumping light, and a coupling optical system for coupling the pumping light emitted out of the semiconductor laser into the optical fiber; a pumping light-signal light coupling unit for coupling the pumping light emitted out of the semiconductor laser device to signal light; and a rare-earth-doped optical fiber that is pumped by the pumping light so as to amplify the signal light output from the pumping light-signal light coupling unit.

In accordance with a further aspect of the present invention, there is provided an optical fiber amplifier comprising: a semiconductor laser device including an optical fiber having an optical fiber grating, a semiconductor laser having an active layer with two or more quantum wells formed at intervals that are close enough to provide quantum coupling, for emitting pumping light, and a coupling optical system for coupling the pumping light emitted out of the semiconductor laser into the optical fiber; a pumping light-signal light coupling unit for coupling the pumping light emitted out of the semiconductor laser device to signal light; and a rare-earth-doped optical fiber that is pumped by the pumping light so as to amplify the signal light output from the pumping light-signal light coupling unit.

Accordingly, in accordance with the present invention, the semiconductor laser device can keep the emission wavelength of the laser light constant with a simple structure and without any temperature control mechanism. In addition, by using a temperature control mechanism which is so simply structured that its temperature control resolution or its temperature control performance is reduced, the semiconductor laser device can control changes in the emission wavelength.

Further objects and advantages of the present invention will be apparent from the following description of the preferred embodiments of the invention as illustrated in the accompanying drawings.

BRIEF DESCRIPTION OF THE DRAWINGS

FIG. 8 is a diagram showing the structure of a semiconductor laser device according to a third embodiment of the present invention;

FIG. 9 is a diagram showing the structure of a semiconductor laser device according to a fourth embodiment of the present invention;

FIG. 10 is a diagram showing an energy band structure in the vicinity of an active layer of a semiconductor laser with a distortion compensation structure of the semiconductor laser device according to a fourth embodiment;

FIG. 14 is a diagram showing the structure of a semiconductor laser device according to another embodiment of the present invention.

DETAILED DESCRIPTION OF THE PREFERRED EMBODIMENTS

Hereafter, preferred embodiments of the present invention will be explained.

Embodiment 1

Figure 1:
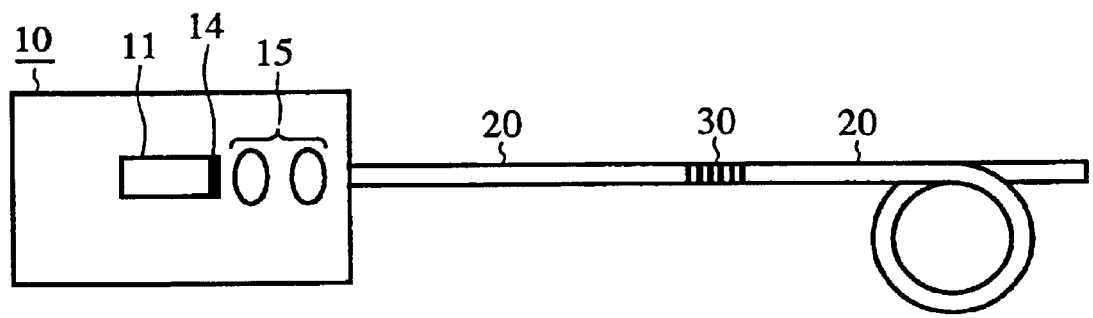
FIG. 1 is a diagram showing the structure of a semiconductor laser device according to a first embodiment of the present invention.

FIG. 1 is a diagram showing the structure of a semiconductor laser device according to a first embodiment of the present invention. In FIG. 1, reference numeral 10 denotes a pump laser module that emits laser light, reference numeral 20 denotes an optical fiber for guiding the laser light from the pump laser module 10, and reference numeral 30 denotes an optical fiber grating formed in the optical fiber 20.

Furthermore, in the pump laser module 10 of FIG. 1, reference numeral 11 denotes a semiconductor laser (i.e. laser diode) having a single quantum well (SQW) active layer, reference numeral 14 denote an anti-reflection coating formed on a laser light emitting exit face of the semiconductor laser 11, and reference numeral 15 denote a coupling optical system for coupling the laser light emitted out of the laser light emitting exit face of the semiconductor laser 11 into the optical fiber 20.

The semiconductor laser 11 with the SQW active layer is used in the pump laser module 10 of FIG. 1 as can be seen compared with a prior art semiconductor laser device. In contrast, no temperature monitor for monitoring the temperature of the pump laser module 10 and no temperature control mechanism, such as a cooler, for keeping the temperature of the pump laser module 10 constant are disposed.

Figure 2:
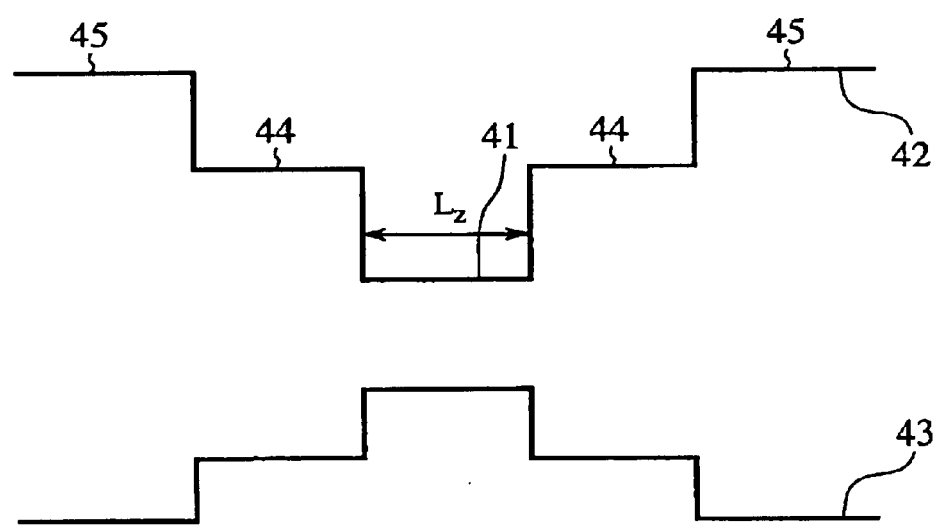
FIG. 2 is a diagram showing an energy band structure in the vicinity of an SQW active layer of a semiconductor laser of the semiconductor laser device according to the first embodiment.

FIG. 2 is a diagram showing an energy band structure in the vicinity of the SQW active layer of the semiconductor laser 11. In FIG. 2, reference numeral 41 denotes the SQW active layer, reference numeral 42 denotes a conduction band, reference numeral 43 denotes a valence band, reference numeral 44 denotes a guide layer, and reference numeral 45 denotes a cladding layer. The SQW active layer 41 is composed of InGaAs of In chemical composition of 0.2, the guide layer 44 is composed of AlGaAs of Al chemical composition of 0.2, and the cladding layer 45 is composed of AlGaAs of Al chemical composition of 0.48.

The SQW active layer 41 of the semiconductor laser 11 can have a thickness Lz ranging from 10 nm to 25 nm. For example, the SQW active layer 41 of the semiconductor laser 11 has a thickness Lz of 18 nm. The guide layer 44 can have a thickness ranging from 10 nm to 500 nm. The Al chemical composition of AlGaAs is adjusted so that it falls within a range of 0.0 to 0.5 from the viewpoint of optical confinement.

The semiconductor laser device of the present invention has the following two features.

<Feature 1>: When the emission wavelength of the semiconductor laser 11 differs or changes from its original value, the semiconductor laser device can keep the emission wavelength constant by means of the optical fiber grating 30.

<Feature 2>: When the temperature of the pump laser module 10 changes greatly, the semiconductor laser device can keep the emission wavelength constant over a wide range of change in the temperature without having to use a temperature control mechanism. This is because the width of the gain spectrum of the semiconductor laser 11 is wide as described later, and therefore the optical fiber grating 30 is so constructed that its wavelength locking cannot be released easily.

First of all, the principle of <Feature 1>will be explained generally.

Figure 3A:
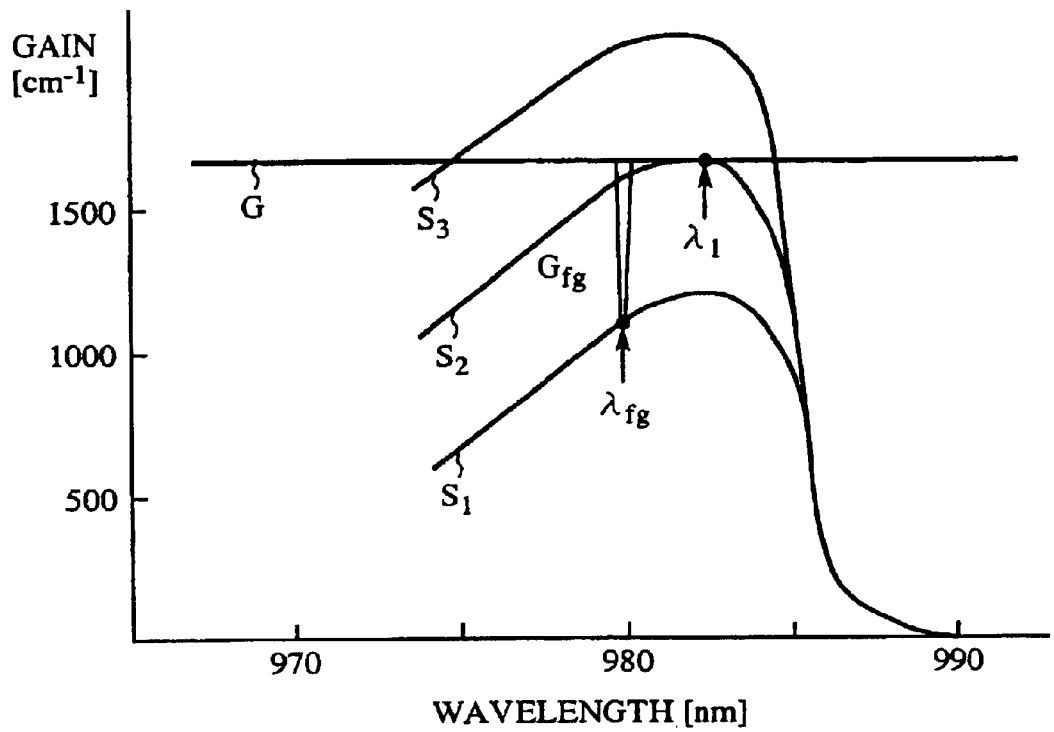
FIGS. 3(a) and 3(b) are diagrams showing that the emission wavelength of the semiconductor laser is kept constant by means of an optical fiber grating.
Figure 3B:
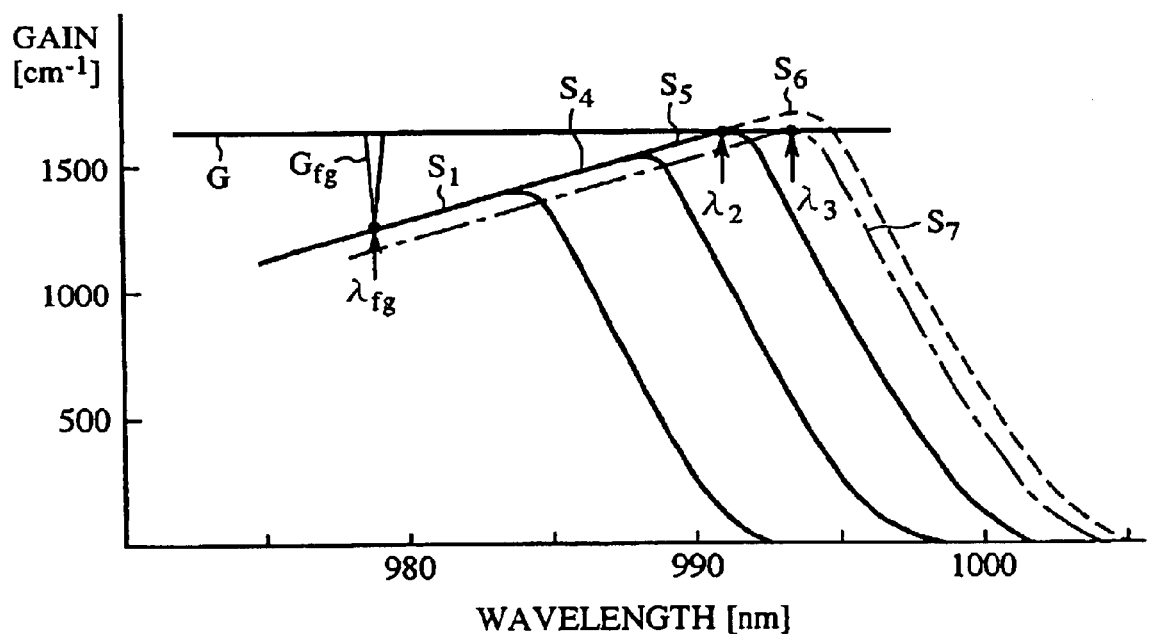

FIGS. 3(a) and 3(b) are diagrams for explaining an operation of the semiconductor laser device when the emission wavelength is kept constant by means of the optical fiber grating. FIG. 3(a) shows changes in the gain spectrum with changes in an electric current passing through the active layer of the semiconductor laser, and FIG. 3(b) shows changes in the gain spectrum with changes in the temperature of the pump laser module. The horizontal axis represents the emission wavelength (nm) and the vertical axis represents the gain ($cm^{-1}$).

Figure 4A:
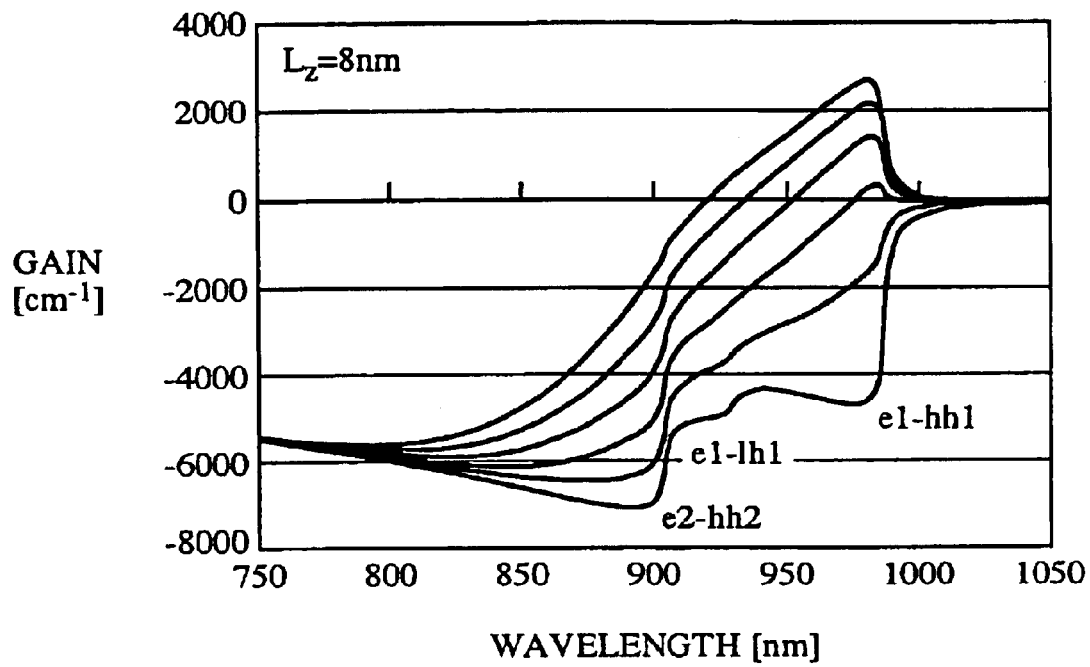
FIGS. 4(a) and 4(b) are diagrams showing an advantage of the semiconductor laser device according to the first embodiment of the present invention.
Figure 4B:
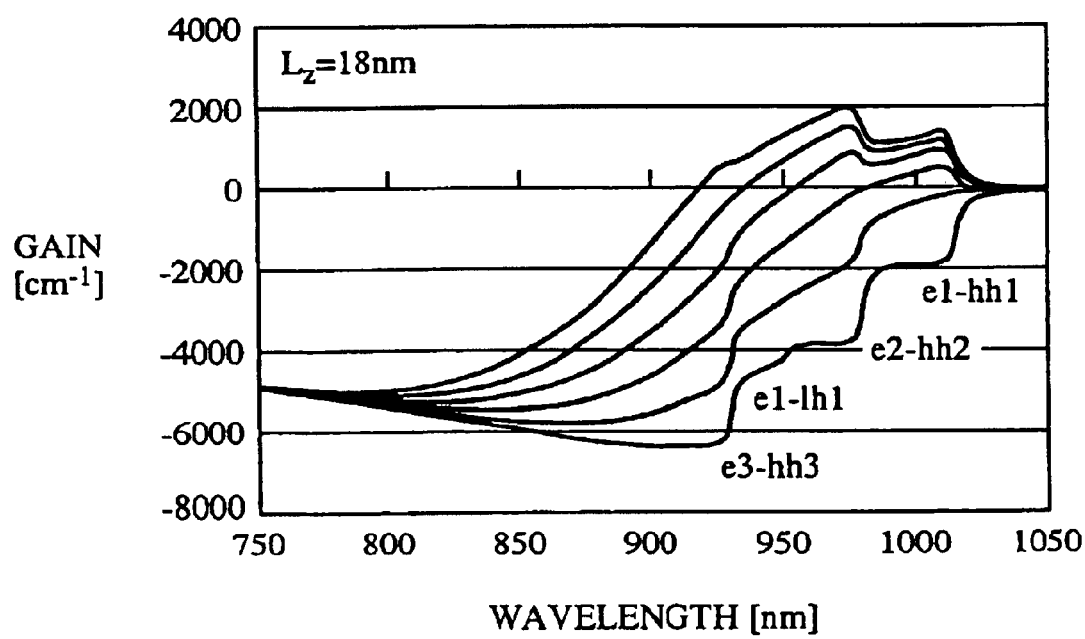

In FIGS. 3(a) and 3(b), $S_1$ to $S_7$ denote gain spectrums of the semiconductor laser. As shown in FIG. 3(a), the gain spectrum $S_1$ at a certain electric current value in turn changes into the gain spectrum $S_2$ and then the gain spectrum $S_3$ with increasing electric current value. Although each of the gain spectrums $S_1$ to $S_7$ actually has a complex shape, as illustrated in FIGS. 4(a) and 4(b), the shapes of the gain spectrums $S_1$ to $S_7$ are simply illustrated in FIGS. 3(a) and 3(b) for the sake of simplicity.

Furthermore, a straight line indicated by a reference character G of FIGS. 3(a) and 3(b) is an optical gain in the case of a single semiconductor laser. Here, the single semiconductor laser means a case where no optical fiber grating is disposed at the output of the semiconductor laser device. When a loss in the semiconductor laser is $\alpha$, the length of cavity is L, the reflectivity of a front facet of the semiconductor laser is $R_f$, the reflectivity of a back facet of the semiconductor laser is $R_r$, and the optical confinement coefficient is $\Gamma$, the optical gain G is given by the following equation (1).

$$\Gamma \cdot G = \alpha + (0.5/L) \cdot \ln[1/(R_f R_r)] \quad (1)$$

In addition, a bent segment of the optical gain G indicated by a reference string $G_{fg}$ of FIGS. 3(a) and 3(b) is a mode gain when the optical fiber grating is disposed at the output of the semiconductor laser device. By using an equivalent front reflectivity $R_{eff}$ of the semiconductor laser when the optical fiber grating is disposed at the output of the semiconductor laser device, the mode gain $G_{fg}$ is given by the following equation (2).

$$\Gamma \cdot G_{fg} = \alpha + (0.5/L) \cdot \ln[1/(R_{eff} R_r)] \quad (2)$$

In the above equations (1) and (2), the loss in the semiconductor laser $\alpha$ ranges from 1 to 20 $cm^{-1}$, the length L of the cavity ranges from 500 $\mu m$ to 3000 $\mu m$, the front reflectivity $R_f$ is 10% or less, the equivalent front reflectivity $R_{eff}$ is 20% or less, the back reflectivity $R_r$ is 80% or more, and the optical confinement coefficient $\Gamma$ ranges from 0.001 to 0.1. In this example, $\alpha = 4$ $cm^{-1}$, $L = 900$ $\mu m$, $R_f = 1\%$, $R_{eff} = 4\%$, $R_r = 98\%$, $\Gamma = 0.0175$, and therefore $G = 1700$ $cm^{-1}$ and $G_{fg} = 1260$ $cm^{-1}$.

When no optical fiber grating is disposed in the semiconductor laser device, the semiconductor laser oscillates at a wavelength $\lambda_1$ at which the maximum value of the gain spectrum $S_2$ agrees with the mode gain G. On the other hand, when the optical fiber grating is disposed in the semiconductor laser device, the semiconductor laser oscillates at an injection current at which the gain spectrum $S_1$ at an electric current less than that for the gain spectrum $S_2$ agrees with the mode gain $G_{fg}$, and the emission wavelength becomes equal to a reflection wavelength $\lambda_{fg}$ of the optical fiber grating, e.g., 980 nm. In the first and second embodiments, a 980-nm band pump laser module is illustrated as an example. As an alternative, the first embodiment can be applied to a 1480-nm band pump laser module.

As the temperature of the pump laser module rises, the gain spectrum $S_1$ changes into the gain spectrum $S_4$ and then the gain spectrum $S_5$, as shown in FIG. 3(b), and the semiconductor laser enters a state at which its emission wavelength is locked to the constant wavelength $\lambda_{fg}$ by the optical fiber grating. However, at the gain spectrum $S_5$, the semiconductor laser enters a state in which the two emission wavelengths $\lambda_{fg}$ and $\lambda_2$ go into competition with each other.

In addition, when the temperature of the pump laser module further rises and the semiconductor laser then enters a state of the gain spectrum $S_6$ with a maximum value which exceeds the mode gain G, the wavelength locking by the optical fiber grating is released because the electric current for the gain spectrum $S_7$ with a maximum value equal to the optical gain G is less than that for the gain spectrum $S_6$ and the semiconductor laser oscillates at a wavelength $\lambda_3$ at which the gain spectrum $S_7$ agrees with the optical gain G.

As can be seen from the above-mentioned calculation, since by reducing the reflectivity $R_f$ of the anti-reflection coating disposed on the laser light emitting exit face of the semiconductor laser to a low one (particularly 10% or less), the difference between the mode gain G in the case of a single semiconductor laser and the mode gain $G_{fg}$ in the case of having an optical fiber grating can be increased, it is possible to maintain the wavelength locking by the optical fiber grating over a wider temperature range.

By the way, as can be seen from the explanation about FIG. 3(b), the wider the width of the gain spectrum in the vicinity of 980 nm and the flatter the peak of the gain spectrum, the wider the range of change in the temperature for the wavelength locking can be made to become. In general, while a semiconductor laser with an MQW active layer has an advantage of achieving a single mode oscillation easily because its gain spectrum has a narrow full width at half maximum (FWHM), the semiconductor laser has a disadvantage resulting from the above-mentioned reason from the viewpoint of the wavelength locking by the optical fiber grating.

Next, based upon the above-mentioned fact a description will be made as to the reason why the temperature range in which the wavelength locking can be carried out is extended, i.e., <Feature 2>in the semiconductor laser device according to the first embodiment provided with the semiconductor laser 11 having an SQW active layer.

FIGS. 4(a) and 4(b) are diagrams for explaining the advantage of the semiconductor laser device according to the first embodiment of the present invention, and the horizontal axis represents the wavelength (nm) and the vertical axis represents the gain (cm$^{-1}$). FIG. 4(a) shows an example of calculation of the gain spectrum when the thickness of the well is 8 nm, which corresponds to the gain spectrum of the prior art MQW active layer 111d, and FIG. 4(b) shows an example of calculation of the gain spectrum when the thickness of the well is 18 nm, which corresponds to the gain spectrum of the SQW active layer 41 of the present invention.

Six curves of FIGS. 4(a) and 4(b) show gain spectrums when changing the carrier density from $1\times10^{17}$ cm$^{-3}$ to $3.1\times10^{18}$ cm$^{-3}$ in steps of $6.0\times10^{17}$ cm$^{-3}$, which correspond to the ones when the semiconductor laser is placed in an oscillation state in a case where the gain at a wavelength of 980 nm becomes 1600 cm$^{-1}$, for example (in the case of FIGS. 3(a) and 3(b)). As can be seen from a comparison of FIG. 4(a) and FIG. 4(b), while the gain spectrum of the MQW active layer 111d in the vicinity of 980 nm has a narrow width and varies abruptly with wavelength when the semiconductor laser is placed in the oscillation state, the gain spectrum of the SQW active layer 41 in the vicinity of 980 nm has a wide width and is flat because of an influence of a e2-hh2 transition. Therefore, due to the fact that the wider the width of the gain spectrum in the vicinity of 980 nm and the flatter the peak of the gain spectrum, the wider the range of change in the temperature for the wavelength locking can be made to become, the semiconductor laser device of FIG. 1 can keep the emission wavelength of the laser light constant over a wide temperature range.

In general, a semiconductor laser with an MQW active layer has an advantage that it easily enters a single-mode of operation because its gain spectrum has a narrow FWHM, whereas a semiconductor laser with an SQW active layer has a disadvantage that it does not easily enter a single-mode of operation. However, there is a trade-off between the single-mode of operation and the wavelength locking using the optical fiber grating 30. In accordance with the first embodiment of the present invention, the range of the wavelength locking using the optical fiber grating 30 can be extended based on the fact that the gain spectrum of the SQW active layer has a wide FWHM and is flat, which usually becomes a drawback.

Thus the semiconductor laser device of the first embodiment with a simple structure can reduce changes in the emission wavelength over a wide temperature range without any temperature control mechanism, unlike a prior art semiconductor laser device. As an alternative, the semiconductor laser device of the first embodiment can be provided with a temperature control mechanism. In this case, the temperature control mechanism for reducing changes in the emission wavelength is so simply structured that its temperature control resolution or its temperature control performance is reduced as compared with that required for a prior art semiconductor laser device. In addition, the first embodiment offers an advantage of being able to permit easing of management of combinations of variations in the threshold gain band of the semiconductor laser 11, which occur during manufacturing, and the wavelength characteristic of the optical fiber grating 30.

As mentioned above, in accordance with the first embodiment of the present invention, the semiconductor laser device comprises an optical fiber 20 having an optical fiber grating 30 formed therein, for guiding laser light, and a pump laser module 10 including a semiconductor laser 11 having an SQW active layer 41, for emitting laser light, and a coupling optical system 15 for coupling the laser light emitted out of the semiconductor laser 11 into the optical fiber 20. Accordingly, the semiconductor laser device can keep the emission wavelength of the laser light constant over a wider temperature range compared with prior art semiconductor laser devices. The semiconductor laser device with a simple structure can thus reduce changes in the emission wavelength without any temperature control mechanism. The semiconductor laser device of the first embodiment can be provided with a temperature control mechanism which is so simply structured that its temperature control resolution or its temperature control performance is reduced so as to control changes in the emission wavelength. In addition, the first embodiment offers an advantage of being able to permit easing of management of combinations of variations in the threshold gain band of the semiconductor laser 11, which occur during manufacturing, and the wavelength characteristic of the optical fiber grating 30.

Furthermore, in accordance with the first embodiment, the semiconductor laser 11 has an anti-reflection coating 14 with a reflectivity of about 10% or less which is formed on laser light emitting exit face thereof. Accordingly, the semiconductor laser device can maintain the wavelength locking by using the optical fiber grating 30 over a wider temperature range.

In addition, in accordance with the first embodiment, the anti-reflection coating 14 has a reflectivity lower than that of the optical fiber grating 30. Accordingly, the semiconductor laser device can maintain the wavelength locking by using the optical fiber grating 30 over a wider temperature range.

In addition, in accordance with the first embodiment, the semiconductor laser 11 includes a single quantum well with an active layer having a thickness ranging from 10 nm to 25 nm. Accordingly, the gain spectrum of the SQW active layer can have a wide FWHM and can be flat, and therefore the range of the wavelength locking using the optical fiber grating 30 can be extended.

Embodiment 2

Figure 5:
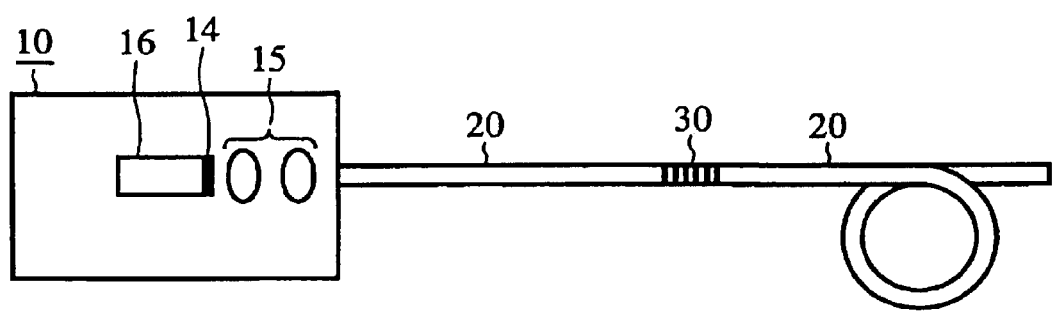
FIG. 5 is a diagram showing the structure of a semiconductor laser device according to a second embodiment of the present invention.

FIG. 5 is a diagram showing the structure of a semiconductor laser device according to a second embodiment of the present invention. The same reference numerals as shown in FIG. 1 denote the same components as those of the first embodiment or like components. In FIG. 5, reference numeral 16 denotes a semiconductor laser having a coupling multiple quantum well (coupling MQW) active layer.

Figure 6:
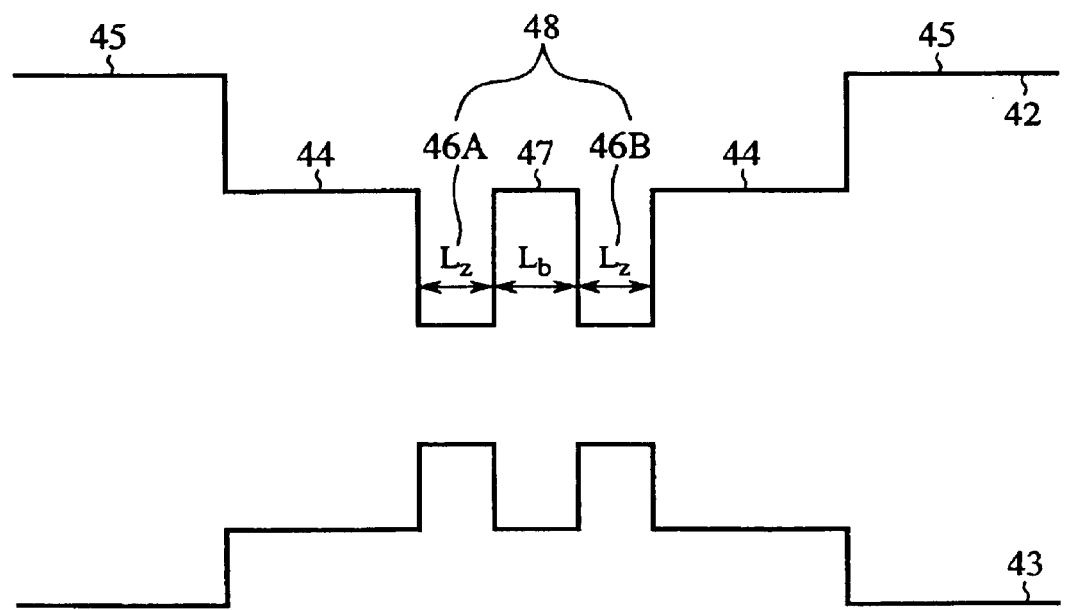
FIG. 6 is a diagram showing an energy band structure in the vicinity of a coupling MQW active layer of a semiconductor laser of the semiconductor laser device according to the second embodiment.

FIG. 6 is a diagram showing an energy band structure in the vicinity of the coupling MQW active layer of the semiconductor laser 16. The same reference numerals as shown in FIG. 2 denote the same components as those of the first embodiment or like components. In FIG. 6, reference numerals 46A and 46B denote quantum wells each of which is composed of InGaAs of In chemical composition of 0.2, reference numeral 47 denotes a barrier layer that is composed of AlGaAs of Al chemical composition of 0.2, and reference numeral 48 denotes a coupling MQW active layer in which the two quantum wells 46A and 46B are coupled to each other.

Each of the quantum wells 46A and 46B of the coupling MQW active layer 48 has a thickness Lz ranging from 5 nm to 15 nm, the barrier layer 47 has a thickness Lb ranging from 0.1 nm to 8 nm, and the guide layer 44 has a thickness ranging from 10 nm to 500 nm. In this example, Lz=8 nm, the thickness Lb of the barrier layer 47=3 nm, and the thickness of the guide layer 44=50 nm. Other conditions, such as Al chemical composition, are equal to those shown in FIG. 2.

The semiconductor laser device according to second embodiment has <Feature 1>, like the above-mentioned first embodiment, because it is provided with an optical fiber grating 30. In addition, since the width of the barrier layer 47 of the semiconductor laser 16 is narrowed to 3 nm to provide quantum coupling, the levels are divided by the interaction between the levels according to the tunnel effect, and the gain spectrum of the semiconductor laser 16 is extended. In other words, the semiconductor laser device of the second embodiment has also <Feature 2>, like the first embodiment.

Furthermore, since the coupling MQW active layer 48 is used, it is possible to easily provide a sufficient optical confinement coefficient even if the thickness Lz of each of the two quantum wells 46A and 46B is reduced to below its critical thickness, and it is therefore possible to improve the degree of freedom of the design. Here, the critical thickness is the limit of an active layer thickness at which no crystal defect is caused even if the lattice constant of the active layer differs from that of the substrate. A crystal defect is caused when the active layer has a thickness equal to or greater than the critical thickness. Therefore when using a material, such as InGaAs, with a lattice constant different from that of GaAs, as the active layer, the critical thickness is an important index.

Since the semiconductor laser according to the second embodiment includes the two quantum wells 46A and 46B each having a thickness equal to or less than the critical thickness, the semiconductor laser device does not suffer from a problem of crystal defect generation due to a mechanical stress, and failures such as degradation of the initial performance, decrease in the light output, and quenching, and therefore the reliability of the semiconductor laser device can be improved.

Next, the reason why the temperature range where the wavelength locking can be carried out is extended when the semiconductor laser 16 with the coupling MQW active layer 48 according to the second embodiment is used will be explained.

Figure 7A:
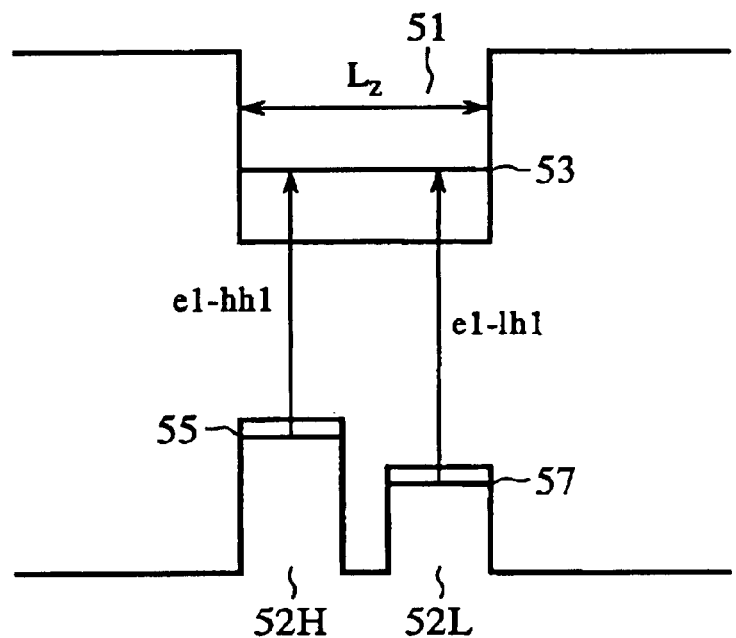
FIGS. 7(a) and 7(b) are diagrams showing an advantage of the semiconductor laser device according to the second embodiment of the present invention.
Figure 7B:
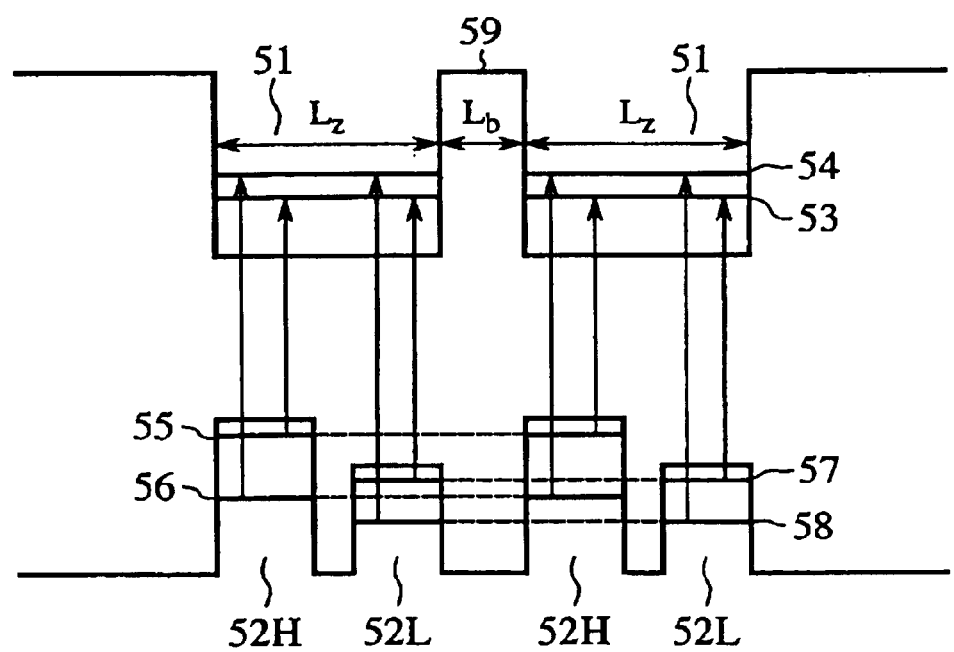
Figure 11:
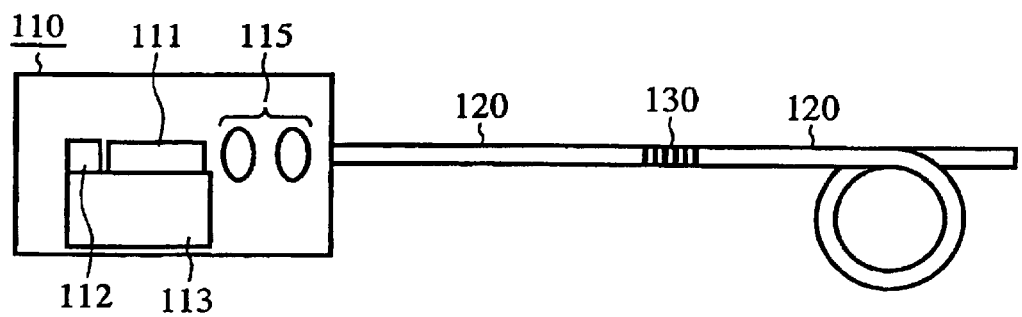
FIG. 11 is a diagram showing the structure of a prior art semiconductor laser device.
Figure 12:
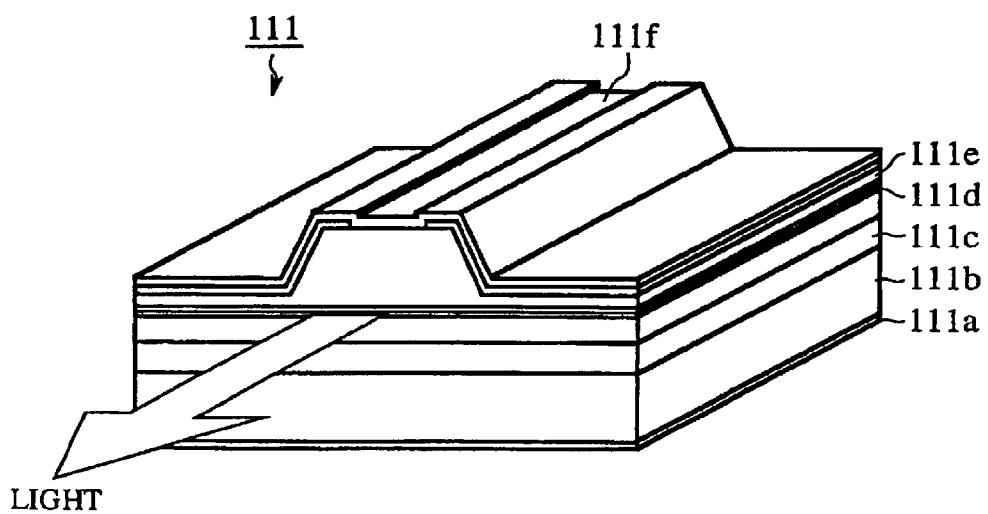
FIG. 12 is a diagram showing an example of the structure of a semiconductor laser of the prior art semiconductor laser device.
Figure 13:
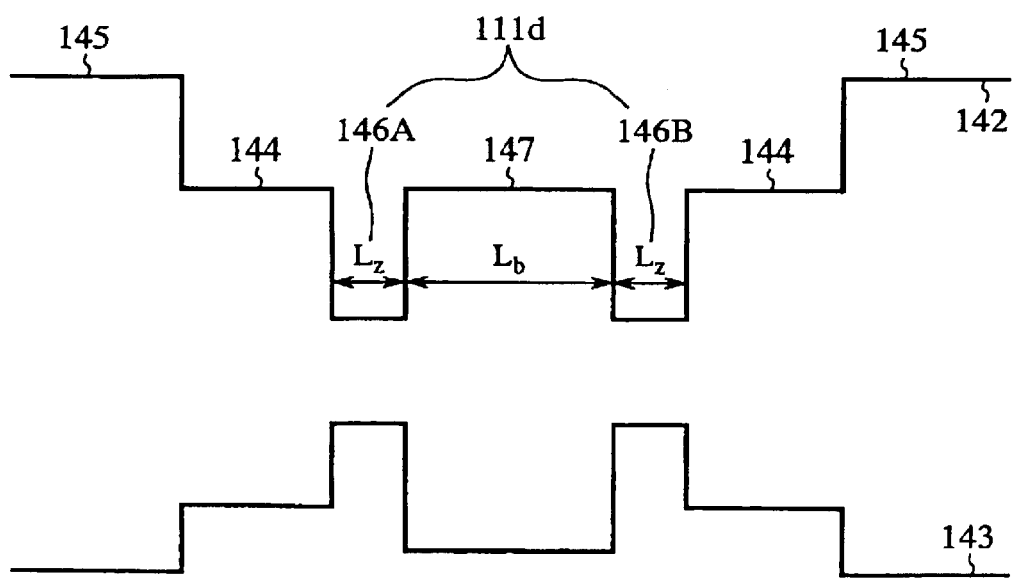
FIG. 13 is a diagram showing an energy band structure in the vicinity of an MQW active layer of the semiconductor laser.

FIGS. 7(a) and 7(b) are diagrams for explaining advantages of the semiconductor laser device according to the second embodiment of the present invention. FIG. 7(a) shows a band structure of a single quantum well having a thickness Lz of 8 nm, and FIG. 7(b) shows a band structure when coupling according to the tunnel effect is provided between the two quantum wells. FIG. 7(a) and FIG. 7(b) show the structure of the active layer 11d of the prior art multiple quantum well semiconductor laser shown in FIG. 13 and that of the coupling MQW active layer 48 of the semiconductor laser 16 of the second embodiment of the present invention shown in the FIG. 6, respectively. In FIG. 7(b), the thickness Lz of each of the two wells is narrowed to 8 nm and the thickness Lb of the barrier layer is narrowed to 3 nm.

In FIGS. 7 (a) and 7 (b), reference numeral 51 denotes a band for electron, reference numeral 52H denotes a band for heavy hole reference numeral 52L denotes a band for light hole, reference numerals 53 and 54 denote a first sub-band and a second sub-band for electron, respectively, reference numerals 55 and 56 denote a first sub-band and a second sub-band for heavy halt hole respectively, reference numerals 57 and 58 denote a first sub-band and a second sub-band for light hole, respectively, and reference numeral 59 denotes a barrier layer.

As explained in <Reference >mentioned below, in FIG. 7 (a), a transition (e1-hh1) from the first sub-band 55 for heavy hole to the first sub-band 53 for electron and a transition (e1-lh1) from the first sub-band 57 for light halt hole to the first sub-band 53 for electron are acceptable. On the other hand, in FIG. 7 (b), since the width of the barrier layer is narrowed to 3 nm, the levels are divided by the interaction among the levels due to the tunnel effect and a transition (e2-hh2) from the second sub-band 56 for heavy hole to the second sub-band 54 for electron and a transition (e2-lh2) from the second sub-band 58 for light halt hole to the second sub-band 54 for electron are acceptable in addition to the transition (e1-hh1) and the transition (e1-lh1).

Therefore, as in the case of FIG. 4(b), the range of the wavelength locking using the optical fiber grating 30 can be extended because the gain spectrum in the vicinity of the e1-hh1 transition becomes flat under the influence of other transitions. <Reference 2>: R.Dingle: "Confined Carrier Quantum State Ultrathin Semiconductor Heterostructure", Festkoerperplobleme XV, Advances in Solid-State Physics, pp. 21 to 48 (1975).

Since the gain spectrum of the coupling MQW active layer has a wide FWHM, and the semiconductor laser with the coupling MQW active layer does not oscillate easily in single mode, the coupling MQW active layer is not generally used in the prior art. In contrast, in accordance with the second embodiment, through the use of the wide FWHM of the gain spectrum of the coupling MQW active layer, which is a drawback usually, the range of the wavelength locking using the optical fiber grating 30 is extended.

As mentioned above, in accordance with the second embodiment of the present invention, the semiconductor laser device comprises an optical fiber 20 having an optical fiber grating 30 formed therein, for guiding laser light, and a pump laser module 10 including a semiconductor laser 16 having a coupling MQW active layer, for emitting laser light, and a coupling optical system 15 for coupling the laser light emitted out of the semiconductor laser 16 into the optical fiber 20. Accordingly, the semiconductor laser device can widen the threshold gain band of the semiconductor laser. Like the semiconductor laser of the first embodiment, the semiconductor laser device with a simple structure can also keep the emission wavelength of the laser light constant over a wider temperature range without any temperature control mechanism. The semiconductor laser device of the second embodiment can be provided with a temperature control mechanism which is so simply structured that its temperature control resolution or its temperature control performance is reduced so as to control changes in the emission wavelength. In addition, the second embodiment offers an advantage of being able to permit easing of management of combinations of variations in the threshold gain band of the semiconductor laser 16, which occur during manufacturing, and the wavelength characteristic of the optical fiber grating 30. The second embodiment offers another advantage of being able to reduce lattice distortions, which can occur between the active layer and the substrate, thereby improving the reliability of the semiconductor laser.

Embodiment 3

FIG. 8 is a diagram showing the structure of a semiconductor laser device according to a third embodiment of the present invention. The same reference numerals as shown in FIG. 1 denote the same components as those of the first embodiment or like components. In FIG. 8, reference numeral 17 denotes a narrow-band filter.

The narrow-band filter 17 is disposed between a collimator lens 15A and a condenser lens 15B which constitute a coupling optical system 15, and has a structure that makes it possible to arbitrarily set an incident angle of laser light from a semiconductor laser 11 upon the narrow-band filter 17. Furthermore, in accordance with the third embodiment, an optical fiber grating 30 formed in an optical fiber 20 has a reflection bandwidth that is set so that it is wider than or substantially equal to a 3 dB bandwidth of the gain of the semiconductor laser 11 or a spectrum FWHM of the semiconductor laser 11.

The laser light, which is emitted out by way of an anti-reflection coating 14 with a reflectivity of 10% or less which is formed on laser light emitting exit face of the semiconductor laser 11, is transformed into parallel light by the collimator lens 15A and is then incident upon the narrow-band filter 17. The laser light, which penetrates the narrow-band filter 17, is focused onto the optical fiber 20 by the condenser lens 15B.

The reflection characteristic of the optical fiber grating 30 cannot easily be changed because it is determined when the grating pattern of the optical fiber grating is produced. Therefore, the reflection bandwidth of the optical fiber grating 30 is set so that it is wider than or substantially equal to the 3 dB bandwidth of the gain of the semiconductor laser 11 or the spectrum FWHM of the semiconductor laser 11, and the incident angle of the laser light with the narrow-band filter 17 can be changed when assembling or adjusting the module.

The incident angle of the laser light with the narrow-band filter 17 can be adjusted and fixed when assembling or adjusting the module and the wavelength of light that can transmit through the narrow-band filter 17 can be set to a desired one so that the optical fiber grating 30 can reflect light having a wavelength suitable for the threshold gain band even if variations in the threshold gain band are caused due to variations in the manufacturing of the semiconductor laser 11.

As mentioned above, in accordance with the third embodiment of the present invention, the coupling optical system 15 comprises a narrow-band filter 17 for adjusting an incident angle of the laser light emitted out of the semiconductor laser 11. Accordingly, the third embodiment offers an advantage of making it possible for the optical fiber grating 30 to reflect light having a wavelength suitable for the threshold gain band even if variations in the threshold gain band are caused due to variations in the manufacturing of the semiconductor laser 11.

Furthermore, in accordance with the third embodiment, since the reflection bandwidth of the optical fiber grating 30 is set so that it is wider than or substantially equal to the 3 dB bandwidth of the gain of the semiconductor laser 11 or the spectrum FWHM of the semiconductor laser 11, the optical fiber grating 30 can reflect light having a wavelength suitable for the threshold gain band even if variations in the threshold gain band are caused due to variations in the manufacturing of the semiconductor laser 11.

In addition, in accordance with the third embodiment, since the coupling optical system 15 comprises a narrow-band filter 17 for adjusting an incident angle of the laser light emitted out of the semiconductor laser 11, and the reflection bandwidth of the optical fiber grating 30 is set so that it is wider than or substantially equal to the 3 dB bandwidth of the gain of the semiconductor laser 11 or the spectrum FWHM of the semiconductor laser 11, the optical fiber grating 30 can reflect light having a wavelength suitable for the threshold gain band even if variations in the threshold gain band are caused due to variations in the manufacturing of the semiconductor laser 11.

In addition, in accordance with the third embodiment, the coupling optical system 15 includes a collimator lens 15A for collimating the laser light emitted out of the semiconductor laser and for outputting the collimated laser light to the narrow-band filter 17, and a condenser lens 15B for focusing the laser light output from the narrow-band filter 17 onto the optical fiber. Accordingly, the third embodiment offers another advantage of being able to couple the laser light from the semiconductor laser 11 into the optical fiber 20 by way of the narrow-band filter 17 with a high degree of efficiency.

Embodiment 4

The narrow-band filter 17 shown in the above-mentioned third embodiment can be applied to the semiconductor laser 16 with a coupling MQW active layer shown in the above-mentioned second embodiment. In this case, the same advantages as offered by the third embodiment are provided. FIG. 9 is a diagram showing the structure of a semiconductor laser device according to a fourth embodiment of the present invention. The same reference numerals as shown in FIGS. 5 and 8 denote the same components as those of the second and third embodiments or like components.

A narrow-band filter 17 is disposed between a collimator lens 15A and a condenser lens 15B which constitute a coupling optical system 15, and has a structure that makes it possible to set an incident angle of laser light from a semiconductor laser 16 with an MQW active layer to an arbitrary one. Furthermore, an optical fiber grating 30 formed in an optical fiber 20 has a reflection bandwidth that is set so that it is wider than or substantially equal to a 3 dB bandwidth of the gain of the semiconductor laser 11 or a spectrum FWHM of the semiconductor laser 11, as in the above-mentioned third embodiment.

The laser light, which is emitted by way of an antireflection coating 14 with a reflectivity of 10% or less which is formed on a laser light emitting exit face of the semiconductor laser 16, is transformed into parallel light by the collimator lens 15A and is then incident upon the narrow-band filter 17. The laser light, which penetrates the narrow-band filter 17, is focused onto and is incident upon the optical fiber 20 by the condenser lens 15B.

The reflection characteristic of the optical fiber grating 30 cannot easily be changed because it is determined when the grating pattern of the optical fiber grating is produced. Therefore, the reflection bandwidth of the optical fiber grating 30 is set so that it is wider than or substantially equal to the 3 dB bandwidth of the gain of the semiconductor laser 11 or the spectrum FWHM of the semiconductor laser 11, and the incident angle of the laser light with the narrow-band filter 17 can be changed when assembling or adjusting the module.

Thus, the incident angle of the laser light with the narrow-band filter 17 can be adjusted and fixed when assembling or adjusting the module and the wavelength of light that can transmit through the narrow-band filter 17 can be set to a desired one so that the optical fiber grating 30 can reflect light having a wavelength suitable for the threshold gain band even if variations in the threshold gain band are caused due to variations in the manufacturing of the semiconductor laser 16, as in the above-mentioned third embodiment.

Embodiment 5

By disposing a layer for relieving a distortion due to grid-interval mismatching outside the SQW active layer of the semiconductor laser 11 of the above-mentioned first embodiment or the coupling MQW active layer of the semiconductor laser 16 of the above-mentioned first embodiment (e.g., by disposing a layer having a refractive index lower than that of a light guide layer disposed outside the SQW active layer and such a thickness as to prevent itself from becoming a barrier that keeps an electric current from flowing through the semiconductor laser outside the light guide layer), or by making the active layer, the barrier layer, and the guide layer be of distortion compensation structure, the frequency of occurrence of crystal defects can be reduced and the rate of accidental failure can be reduced.

FIG. 10 is a diagram showing an energy band structure in the vicinity of an active layer of a semiconductor laser of distortion compensation structure. In FIG. 10, reference numeral 61 denotes a conduction band, reference numeral 62 denotes a valence band, reference numerals 63A and 63B denote quantum wells, respectively, reference numeral 64 denotes a barrier layer, reference numeral 65 denotes a guide layer, and reference numeral 66 denotes a cladding layer. Each of the two quantum wells 63A and 63B is composed of InGaAs of In chemical composition of 0.2, the barrier layer 64 is composed of GaAsP, the guide layer 65 is composed of $Ga_{0.8}In_{0.2}As_{0.62}P_{0.38}$, and the cladding layer 66 is composed of $Ga_{0.51}In_{0.49}P$. The quantum well 63 has a thickness of 8 nm, the barrier layer 64 has a thickness of 20 nm, and the guide layer 65 has a thickness of 80 nm.

As explained in the above-mentioned second embodiment, a distortion is caused in the crystal because InGaAs has a lattice constant different from that of a GaAs substrate. Between two materials, there can be provided a ratio of a difference between the lattice constant of one of them and that of the other material to the lattice constant of one of them, which is called the amount of distortion. In this example, by setting the amount of distortion between the barrier layer and the GaAs substrate to be −1.0%, and setting the amount of distortion between each quantum well and the GaAs substrate to be +1.4%, the average amount of distortion between the substrate and the vicinity of the active layer can be reduced.

By using a semiconductor laser with an SQW active layer or a coupling MQW active layer, in which a layer for relieving a distortion due to grid-interval mismatching is disposed outside the SQW active layer or the coupling MQW active layer, or the active layer, the barrier layer, and the guide layer are made to be of distortion compensation structure, as the semiconductor laser 11 of the above-mentioned first embodiment or the semiconductor laser 16 of the above-mentioned second embodiment, the fifth embodiment offers an advantage of being able to generate laser light output having a stable emission wavelength over a wide temperature range without any temperature control, like the above-mentioned first or second embodiment. The fifth embodiment also offers an advantage of being able to permit easing of management of combinations of variations in the threshold gain band of the semiconductor laser, which occur during manufacturing, and the wavelength characteristic of the optical fiber grating 30 even when a temperature monitor and a cooler are provided.

As mentioned above, in according to the fifth embodiment of the present invention, the semiconductor laser 11 or 16 includes a layer having a refraction index lower than that of the optical guide layer disposed outside the active layer with the single quantum well, the layer having such a thickness as to prevent itself from becoming a barrier that keeps an electric current from flowing through the semiconductor laser and the layer being disposed outside the optical guide layer. Accordingly, the fifth embodiment offers an advantage of being able to reduce the frequency of occurrence of crystal defects and the rate of accidental failure.

Furthermore, in accordance with the fifth embodiment, the active layer, the barrier layer, and the guide layer of the semiconductor laser 11 or 16 are configured to have a distortion compensating structure. Even in this case, the fifth embodiment offers an advantage of being able to reduce the frequency of occurrence of crystal defects and the rate of accidental failure.

Embodiment 6

By setting intervals at which two or more quantum wells are formed in a semiconductor laser 16 with a coupling MQW active layer shown in the above-mentioned second embodiment to be 8 nm or less, the two quantum wells can be coupled to each other with a high degree of efficiency. Therefore, since the semiconductor laser 16 can provide a wide threshold gain band and high efficiency, and can generate laser light having a stable emission wavelength over a wide temperature range, like the second above-mentioned embodiment, the semiconductor laser device can provide laser light having a stable emission wavelength over a wide temperature range without any temperature control by forming an external resonator by optically coupling the semiconductor laser 16 to an optical fiber 20 having an optical fiber grating 30.

Furthermore, like the above-mentioned fourth embodiment, by arranging a narrow-band filter 17 located on an emitting exit face side of the semiconductor laser 16, an optical fiber 20 into which laser light from the semiconductor laser 16 is coupled by way of the narrow-band filter 17, and an optical fiber grating 30 formed in the optical fiber 20, and having a reflection bandwidth wider than or substantially equal to a 3 dB bandwidth of the gain of the semiconductor laser 16 or a spectrum FWHM of the semiconductor laser 16, laser light having a stable emission wavelength can be generated over a wide temperature range without any temperature control.

The sixth embodiment offers an advantage of being able to permit easing of management of combinations of variations in the threshold gain band of the semiconductor laser 16, which occur during manufacturing, and the wavelength characteristic of the optical fiber grating 30 even when the semiconductor laser device is provided with a temperature monitor and a cooler.

As mentioned above, in accordance with the sixth embodiment of the present invention, since the semiconductor laser 16 has two or more quantum wells formed at intervals of 8 nm or less, quantum coupling can be provided with a high degree of efficiency.

Embodiment 7

An optical fiber grating having a reflection bandwidth of 5 nm or more can be used as an optical fiber grating 30 shown in the above-mentioned third or fourth embodiment. Through the use of the optical fiber grating 30 an external resonator is formed and laser light having a stable emission wavelength can be produced over a wide temperature range. Furthermore, the semiconductor laser device can accommodate to variations in the threshold gain band of the semiconductor laser with the single kind of optical fiber grating 30.

As mentioned above, in accordance with the seventh embodiment of the present invention, since the semiconductor laser device includes the optical fiber grating 30 having a reflection bandwidth of 5 nm or more, the optical fiber grating 30 can form an external resonator, and the semiconductor laser device can generate laser light having a stable emission wavelength over a wide temperature range and can accommodate to variations in the threshold gain band of the semiconductor laser.

Embodiment 8

The semiconductor laser device according to the above-mentioned first or second embodiment can be provided with a semiconductor laser 11 or 16 having an anti-reflection coating 14 with a reflectivity of 10% or less formed on a laser light emitting exit face thereof, and an optical fiber 20 containing an optical fiber grating 30 with a reflectivity higher than that of the anti-reflection coating 14. The semiconductor laser can therefore oscillate at the same wavelength as the reflection wavelength of the optical fiber grating 30 over a wide temperature range.

Furthermore, the semiconductor laser device according to the above-mentioned third or fourth embodiment can be provided with a semiconductor laser 11 or 16 having an anti-reflection coating 14 with a reflectivity of 10% or less formed on a laser light emitting exit face thereof, and an optical fiber 20 containing an optical fiber grating 30 with a reflectivity higher than that of the anti-reflection coating 14. The semiconductor laser can therefore oscillate at a wavelength associated with the wavelength characteristic of a narrow-band filter 17 used in the above-mentioned third or fourth embodiment.

Embodiment 9

There can be provided an incident angle adjustment mechanism for adjusting the incident angle of laser light incident upon a narrow-band filter 17 so that it approaches 90° at high ambient temperature. For example, as shown in FIG. 9, this incident angle adjustment mechanism 40 includes a temperature monitor 41 for monitoring the temperature of the semiconductor laser device, and a control unit 42 for storing a relationship between the incident angle of the laser light with the narrow—band filter 17 and the transmission property of the narrow-band filter 17 while making a function and table associated with the relationship, and adjusting the incident angle of the laser tight with the narrow-band filter 17 by referring to the temperature (i.e. thermistor 43) monitored by the temperature monitor and the function and table associated with the relationship. The incident angle of the laser light with the narrow-band filter 17 can be varied according to the temperature of the semiconductor laser device so that light having a certain wavelength always passes through the narrow-band filter 17.

Thus, the provision of the incident angle adjustment mechanism for adjusting the incident angle of laser light incident upon the narrow-band filter 17 so that it approaches 90° at high ambient temperature makes it possible to make the reflection bandwidth of the optical fiber grating 30 change into a longer one with increasing ambient temperature, and make the semiconductor laser device oscillate in external resonator mode over a wide temperature range, thereby maintaining the emission wavelength so that it falls within the bandwidth of the gain of an optical fiber amplifier including the semiconductor laser device.

There can be provided an optical fiber amplifier that includes the semiconductor laser device according to any one of the above-mentioned first through ninth embodiments as an excitation light source. The optical fiber amplifier can comprise a pumping light-signal light coupling unit 50 for coupling laser light emitted, as pumping light, by the semiconductor laser device and another laser light provided as signal light 51 and a rare-earth-doped optical fiber 52 which is pumped by the pumping light from the pumping light-signal light coupling unit so as to amplify the signal light from the pumping light-signal light coupling unit. The optical fiber amplifier can thus control the change in the gain-wavelength characteristic of the semiconductor laser device.

As mentioned above, in accordance with the ninth embodiment of the present invention, since the narrow-band filter 17 is provided with an incident angle adjustment mechanism for adjusting the incident angle of laser light incident thereupon so that it approaches 90° at high ambient temperature, the semiconductor laser device makes it possible to make the reflection bandwidth of the optical fiber grating 30 change into a longer one with increasing ambient temperature, and make the semiconductor laser oscillate in external resonator mode over a wide temperature range, thereby maintaining the emission wavelength so that it falls within the gain bandwidth of an optical fiber amplifier including the semiconductor laser device.

Furthermore, in accordance with the ninth embodiment, there can be provided an optical fiber amplifier that includes a semiconductor laser device according to the present invention, a pumping light-signal light coupling unit for coupling laser light emitted, as pumping light, by the semiconductor laser device and other laser light provided as signal light, and a rare-earth-doped optical fiber which is pumped by the pumping light from the pumping light-signal light coupling unit so as to amplify the signal light from the pumping light-signal light coupling unit, thereby controlling the change in the gain-wavelength characteristic of the semiconductor laser device.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor laser device comprising: an optical fiber having an optical fiber grating;
   a laser diode having a plurality of layers including an active layer with a single quantum well, for emitting laser light; and
   a coupling optical system for coupling the laser light emitted out of the laser diode into the optical fiber wherein the optical fiber grating having a wavelength characteristic which maintains a constant emission wavelength of the laser diode.

2. The semiconductor laser device according to claim 1, wherein the coupling optical system includes a narrow-band filter for adjusting an incident angle of the laser light emitted out of the laser diode.

3. The semiconductor laser device according to claim 1, wherein the optical fiber grating has a reflection bandwidth wider than or substantially equal to a 3 dB bandwidth of a gain of the laser diode or a spectrum full width at half maximum of the laser light of the laser diode.

4. The semiconductor laser device according to claim 1, wherein the coupling optical system has a narrow-band filter for adjusting an incident angle of the laser light emitted out of the laser diode, and wherein the optical fiber grating has a reflection bandwidth wider than or substantially equal to a 3 dB bandwidth of a gain of the laser diode or a spectrum full width at half maximum of the laser light of the laser diode.

5. The semiconductor laser device according to claim 2, wherein the coupling optical system includes a collimator lens for collimating the laser light emitted out of the laser diode and for outputting the collimated laser light to the narrow-band filter, and a condenser lens for focusing the laser light output from the narrow-band filter onto the optical fiber.

6. The semiconductor laser device according to claim 1, wherein the laser diode has an anti-reflection coating with a reflectivity of about 10% or less, which is formed on an emitting exit face thereof from which the laser light is emitted.

7. The semiconductor laser device according to claim 6, wherein the anti-reflection coating has a reflectivity lower than that of the optical fiber grating.

8. The semiconductor laser device according to claim 1, wherein the laser diode includes a layer having a refraction index lower than that of an optical guide layer said layer having such a thickness as to prevent itself from becoming a barrier that keeps an electric current from flowing through the laser diode and said layer being disposed between the optical guide layer and the active layer with the single quantum well.

9. The semiconductor laser device according to claim 1, wherein the active layer, a barrier layer, and a guide layer of the laser diode are configured to have a distortion compensating structure.

10. The semiconductor laser device according to claim 2, wherein the optical fiber grating has a reflection bandwidth of 5 nm or more.

11. The semiconductor laser device according to claim 2, wherein the narrow-band filter includes an incident angle adjusting mechanism for adjusting the narrow-band filter so that the incident angle of the laser light incident on the narrow-band filter approaches 90 degrees with increasing ambient temperature.

12. The semiconductor laser device according to claim 1, wherein the active layer with the single quantum well of the laser diode has a thickness ranging from 10 nm to 25 nm.

13. A semiconductor laser device comprising:
   an optical fiber having an optical fiber grating;
   a laser diode having a plurality of layers including an active layer with two or more quantum wells formed at intervals that are close enough to provide quantum coupling, for emitting laser light; and
   a coupling optical system for coupling the laser light emitted out of the laser diode into the optical fiber.

14. The semiconductor laser device according to claim 13, wherein the coupling optical system includes a narrow-band filter for adjusting an incident angle of the laser light emitted out of the so laser diode.

15. The semiconductor laser device according to claim 13, wherein the optical fiber grating has a reflection bandwidth wider than or substantially equal to a 3 dB bandwidth of a gain of the laser diode or a spectrum full width at half maximum of the laser light of the laser diode.

16. The semiconductor laser device according to claim 13, wherein the coupling optical system has a narrow-band filter for adjusting an incident angle of the laser light emitted out of the laser diode and wherein the optical fiber grating has a reflection bandwidth wider than or substantially equal to a 3 dB bandwidth of a gain of the laser diode or a spectrum full width at half maximum of the laser light of the laser diode.

17. The semiconductor laser device according to claim 14, wherein the coupling optical system includes a collimator lens for collimating the laser light emitted out of the laser diode and for outputting the collimated laser light to the narrow-band filter, and a condenser lens for focusing the laser light output from the narrow-band filter onto the optical fiber.

18. The semiconductor laser device according to claim 13, wherein the semiconductor laser diode has an anti-reflection coating with a reflectivity of about 10% or less, which is formed on an emitting exit face thereof from which the laser light is emitted.

19. The semiconductor laser device according to claim 18, wherein the anti-reflection coating has a reflectivity lower than that of the optical fiber grating.

20. The semiconductor laser device according to claim 13, wherein the active layer, a barrier layer, and a guide layer of the laser diode are configured to have a distortion compensating structure.

21. The semiconductor laser device according to claim 13, wherein the two or more quantum wells are formed at intervals of 8 nm or less.

22. The semiconductor laser device according to claim 14, wherein the optical fiber grating has a reflection bandwidth of 5 nm or more.

23. The semiconductor laser device according to claim 14, wherein the narrow-band filter includes an incident angle adjusting mechanism for adjusting the narrow-band filter so that the incident angle of the laser light incident on the narrow-band filter approaches 90 degrees with increasing ambient temperature.

24. The semiconductor laser device according to claim 13, wherein the optical fiber grating having a wavelength characteristic which maintains a constant emission wavelength of the laser diode.

* * * * *